US007639075B2

United States Patent
Lin

(10) Patent No.: US 7,639,075 B2
(45) Date of Patent: Dec. 29, 2009

(54) WIDE-BAND ADJUSTABLE GAIN LOW-NOISE AMPLIFIER

(75) Inventor: Chia-Liang Lin, Union City, CA (US)

(73) Assignee: Realtek Semiconductor Corporation (TW)

( * ) Notice: Subject to any disclaimer, the term of this patent is extended or adjusted under 35 U.S.C. 154(b) by 142 days.

(21) Appl. No.: 11/831,724

(22) Filed: Jul. 31, 2007

(65) Prior Publication Data

US 2008/0211582 A1    Sep. 4, 2008

Related U.S. Application Data

(60) Provisional application No. 60/892,542, filed on Mar. 2, 2007.

(51) Int. Cl.
*H03F 1/14* (2006.01)
(52) U.S. Cl. .................. 330/51; 330/124 R; 330/278; 330/295
(58) Field of Classification Search .................. 330/51, 330/124 R, 278, 295
See application file for complete search history.

(56) References Cited

U.S. PATENT DOCUMENTS

| 3,735,393 | A * | 5/1973 | Carbrey ........................ 341/127 |
| 4,871,976 | A * | 10/1989 | Watanabe et al. .............. 330/69 |
| 5,939,938 | A * | 8/1999 | Kalb et al. ...................... 330/51 |
| 6,621,346 | B1 * | 9/2003 | Nabicht et al. ............... 330/284 |
| 7,190,219 | B2 * | 3/2007 | Burns et al. .................. 330/129 |

* cited by examiner

*Primary Examiner*—Patricia Nguyen
(74) *Attorney, Agent, or Firm*—Schwegman, Lundberg & Woessner, P.A.

(57) ABSTRACT

A wide-band adjustable gain low-noise amplifier (LNA) is disclosed. In various embodiments, the LNA includes a first sub-circuit and a second sub-circuit coupled in parallel. In various embodiments, the first sub-circuit includes an amplifier configured to receive power when a logical signal is asserted and de-powered otherwise. In various embodiments, the second sub-circuit includes an amplifier configured to shunt an input node to a reference node using a resistor when the logical signal is de-asserted. Methods according to various embodiments of the invention are also disclosed.

37 Claims, 5 Drawing Sheets

WIDE-BAND ADJUSTABLE GAIN LOW-NOISE AMPLIFIER

RELATED APPLICATION

This application claims the benefit of U.S. Provisional Application Ser. No. 60/892,542 filed Mar. 2, 2007, titled "Wide-Band Adjustable Gain Low-Noise Amplifier", which application is incorporated herein by reference.

TECHNICAL FIELD

The various embodiments described herein relate generally to amplifier circuits, including wide-band frequency adjustable gain low-noise amplifiers.

BACKGROUND

Wireless systems enable a mobile user to communicate with others through the broadcast of electromagnetic radiation. Wireless terminals generally include receiver circuitry for capturing broadcast signals. Many receivers include amplification circuitry at the front-end to amplify received signals before down converting for further processing. Such amplification circuitry will amplify noise mixed in with the received radio frequency (RF) signal and can generate its own noise as well. The amplification and generation of noise can reduce the quality of the received signal, and consequently, reduce the distances over which information in the signal may be detected. Conversely, reducing the receiver's noise figure (NF) can increase the ability to detect broadcast radiation. Thus, reducing the NF of a receiver may enable detection of information in signals transmitted at increasing greater distances from the receiver.

RF amplification circuits are generally designed to process signals within a specified frequency range. A conventional television broadcast systems, which is an example of a wide-band system operating from about 50 MHz to about 860 MHz, requires a receiver having a certain minimum amplifier gain, return loss and NF in order to efficiently convert a broadcast signal for viewing. Amplifier gain quantifies the magnitude of the amplification provided by an amplifier. Return loss quantifies the degree to which the amplifier's input impedance matches the impedance of a preceding circuit (i.e., a source impedance). The NF quantifies the amount of additive noise introduced by the amplifier. An increasingly higher gain indicates the amplifier provides increasingly larger signal amplification, an increasingly higher return loss indicates the input impedance of the amplifier is increasingly better matched to the source impedance. A decreasing or lower NF indicates the amplifier introduces an increasingly lower level of noise.

The dynamic gain range of an amplifier is another parameter that can affect receiver performance. Since atmospheric conditions and distances between a transmission station and a receiver can vary, so can signal strength. A receiver must generally be able to process RF signals over wide dynamic gain range to accommodate variations signal strengths. A useful RF signal may range from a low of about −90 dBm to a high of about −25 dBm at the receiver. Such a wide range can be accommodated by adjusting receiver gain, for example, by setting a lower gain when the received signal strength is greater and setting a higher gain when the received signal strength is weaker. If the received signal is strong, the noise introduced by an amplifier is less significant and a larger NF can often be tolerated. If, however, the received signal is weak, the noise introduced by an amplifier can be significant, and therefore, a low NF is more desirable. In addition to gain and NF parameters, matching the receiver's input impedance to the signal's source impedance is also an important consideration. A higher return loss generally means the receiver's impendence matches better with the signal's source impedance and thus more useful signal is available for processing. What is needed then is a wide-band frequency amplifier with a widely adjustable gain that allows for good impedance matching to a source circuit, and has a low NF.

BRIEF SUMMARY OF THE EMBODIMENTS

Good reception of weak RF signals usually require use of a high gain amplifier to boost signal amplitude. For many RF applications though, the NF of an amplifier is important when the amplifier's gain is sufficiently high. Moreover, good reception of a strong signals may not require high gain, and in fact, use of a high gain may introduce output signal distortion. One way to optimize signal reception, without substantially compromising NF or substantially distorting the amplified signal, is to adjust amplifier gain according to the received signal strength. For these and other applications, a first amplifier providing high gain with a narrow range of gain adjustment and low NF, and a second amplifier providing a lower gain with a wider range of gain adjustment can be combined to form a wide-band adjustable gain low noise amplifier (LNA).

In an embodiment, a wide-band adjustable gain LNA includes the parallel connection of a first sub-circuit and a second sub-circuit. The first sub-circuit includes a first amplifier receiving power when a logical signal is asserted and powered down otherwise. The second sub-circuit includes a second amplifier in which an input node is shunted to a reference node via a resistance when the logical signal is de-asserted.

In another embodiment, a wide-band adjustable gain LNA includes the a resistance, a first sub-circuit and a second sub-circuit. A first port of the first sub-circuit is coupled to an input port, and a second port of the first sub-circuit is coupled to an output port. The first sub-circuit receives power only when a logical signal is asserted. A first port of the second sub-circuit is coupled to the input port and a second port of the second sub-circuit is coupled to the output port. The wide-band adjustable gain LNA includes an input port that is shunted to ground by a resistance when the logical signal is de-asserted.

In another embodiment, a wide-band adjustable gain LNA having an input port, an output port, and a resistance. The wide-band adjustable gain LNA includes a first sub-circuit with a first port coupled to the input port and a second port coupled to the output port. An amplifier included in the first sub-circuit is configured to receive power when a logical signal is asserted. The wide-band adjustable gain LNA also includes a second sub-circuit with a port coupled to the input port and a port coupled to the output port. The input port is configured to be shunted to a reference node by the resistor when the logical signal is de-asserted.

In another embodiment, a method includes determining a signal strength. The method includes coupling a first input signal to an output node using a first amplifier if the signal strength equals or exceeds a threshold value, wherein coupling the first input signal includes activating the first amplifier using a first logical signal. The method further includes coupling a second input signal to the output node using a second amplifier if the signal strength is less than the threshold value. In this method, coupling a second input signal includes deactivating the first amplifier and shunting an input node of the second amplifier to a reference node with a resistor using a second logical signal.

DETAILED DESCRIPTION

The following detailed description refers to the accompanying drawings that show, by way of illustration, specific details and embodiments in which the invention may be practiced. These embodiments, which are also referred to herein as "examples," are described in sufficient detail to enable those skilled in the art to practice the invention.

In various embodiments, an amplifier structure includes metal oxide field effect transistors (MOSFETs), such as a p-channel (PMOS) or an n-channel (NMOS) transistor, bipolar junction transistors (BJTs), heterojunction bipolar transistors (HBTs), and high electron mobility transistors (HEMTs).

In some embodiments, a low noise means a NF of less than about 3 dB, a high gain means a signal gain greater than about 10 dB, and a high impedance means and impedance substantially greater than the impedance associated with a source circuit.

Figure 1A:
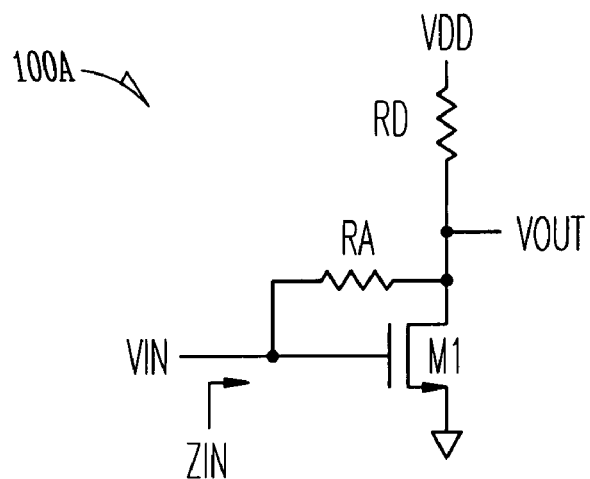
FIG. 1A illustrates a shunt-series amplifier.

A wide-band LNA can be implemented using a shunt-series architecture. FIG. 1A is an example of a shunt-series amplifier 100A that includes a NMOS transistor M1 configured in common-source amplifier topology, a load resistor RD and a feedback resistor Ra. The input impedance ZIN of amplifier 100A is determined by the combination Ra, RD, and the trans-conductance of M1. By properly choosing Ra, RD, and the trans-conductance of M1, one can make ZIN substantially match an impedance of a preceding impedance (or source impedance). If the bias current for M1 is sufficiently large, amplifier 100A can provide a NF of nor more than 3 dB and a gain of no less than 15 dB. The gain for amplifier 100A can also be adjusted by adjusting the values of Ra, RD and the trans-conductance of transistor M1. However, achieving a widely adjustable range of gain without significantly degrading the impedance match between a source impedance and ZIN can be difficult. Since maintaining a good impedance match over the entire range of gain is desirable and at times mandatory, the range over which the gain can be adjusted without compromising the ability to match impedances using the shunt-series amplifier configuration is limited.

Figure 1B:
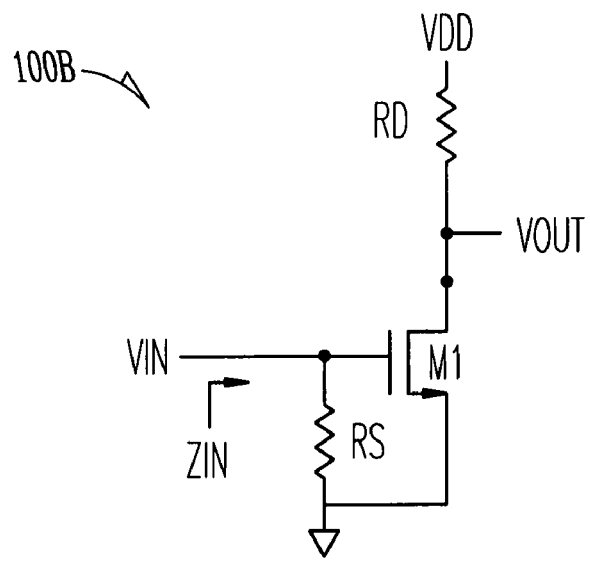
FIG. 1B illustrates a common-source amplifier with an input shunt resistor.

FIG. 1B illustrates a common-source amplifier 100B with an input shunt resistor RS. In this example, which is an alternative to the shunt-series amplifier 100A configuration, a NMOS transistor M1 is configured in a common-source amplifier topology. The gain for amplifier 100B can be adjusted by adjusting the value of load resistor RD and the trans-conductance of M1. Since the input impedance of M1 is large, the input impedance ZIN for amplifier 100B is approximately equal to value of RS. A value for RS can therefore be selected to match the source impedance over a wide range of frequencies, independent of RD and the trans-conductance of M1. A conventional television tuner, for example, has a source impedance 75Ω, which is a value that can be easily matched. Because ZIN is predominantly resistive and is approximately equal to a constant value, amplifier 100B can provide good input resistance matching over a wide frequency range.

Even though the gain of amplifier 100B can be adjusted over a wide range of frequencies, while maintaining an impedance match between a source circuit and the amplifier, the NF of amplifier 100B can be poor due to thermal noise introduced by RS. To be specific, the NF of a common-source amplifier is typically and almost always greater than 3 dB, provided the value RS matches the source impedance. Since NF is important to signal quality, use of a common-source amplifier configuration is limited.

As described, the shunt-series amplifier 100A in FIG. 1A can provide a low noise NF and good input matching to a source circuit, but not a wide range in amplifier gain. The common source amplifier 100B can also provide good input match to a source circuit, and wide adjustable gain range, but not a low NF.

Figure 2:
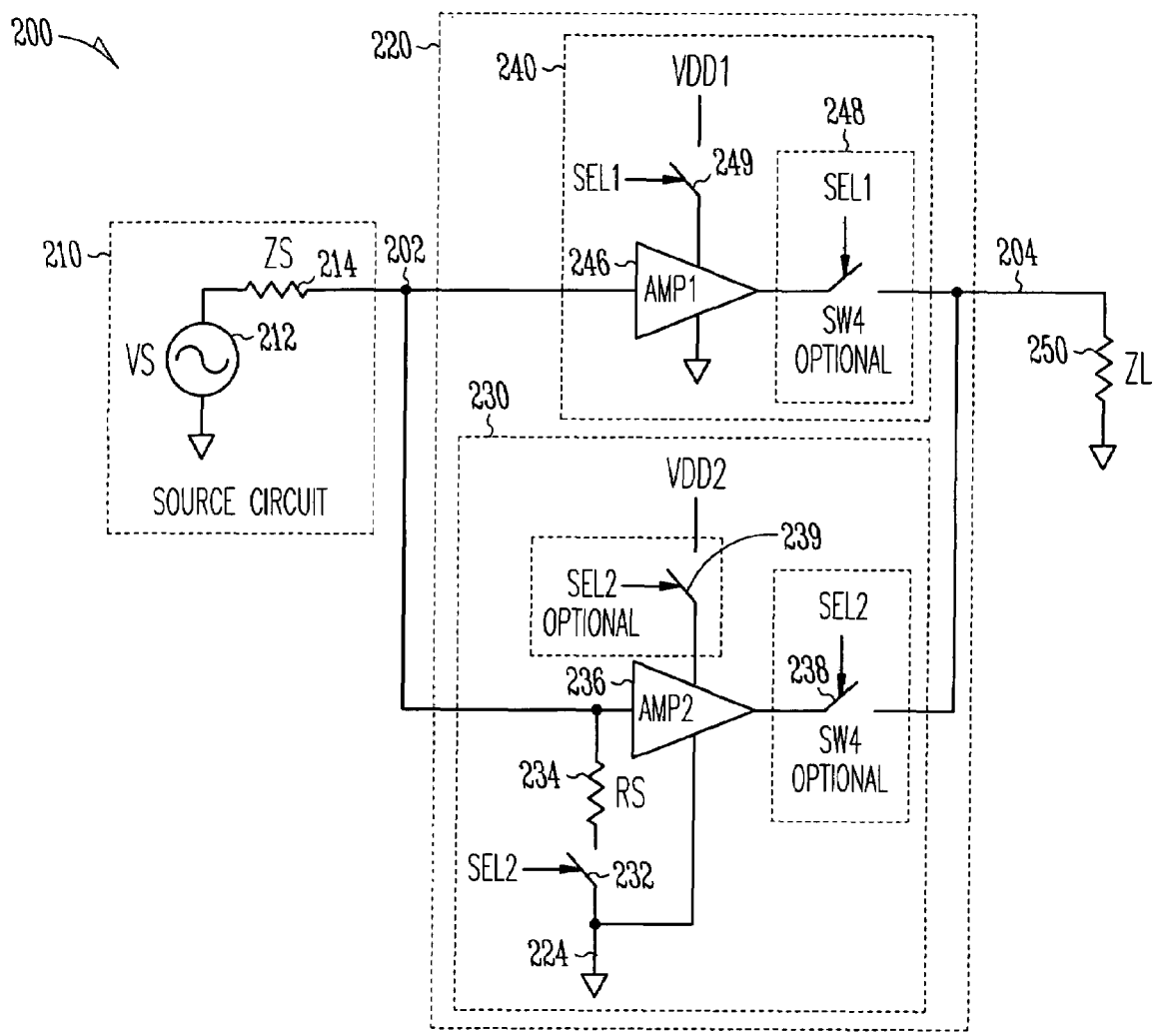
FIG. 2 illustrates an amplifier circuit according to various embodiments of the invention.

FIG. 2 illustrates an amplifier according to various embodiments of the invention. In this example, circuit 200 includes source circuit 210 and wide-band adjustable gain low noise amplifier 220 coupled to load impedance 250. Source circuit 210 includes a voltage source 212 and a source impedance 214. Amplifier 220 includes a first sub-circuit 240 and a second sub-circuit 230, both coupled to common input node 202. Amplifier 240 and amplifier 230 are further coupled to the load impedance 250 at output node 204.

The first sub-circuit 240 includes an amplifier 246 having a high gain, narrow adjustable gain range, and low NF. Switch 249 and optional switch 248 are configured to receive signal SEL1 and are normally open. When a first logical signal SEL1 is asserted, switch 249 is closed and amplifier 246 receives power from the voltage source VDD1. Unless the first logical signal SEL1 is asserted, amplifier 246 is powered off.

Switch 248 is configured to receive signal SEL1 to decouple amplifier 246 from the load impedance 250 when amplifier 246 is powered off. Switch 248 can be used to provide further electrical isolation between the amplifier 246 and the load impedance 250. This electrical isolation is desirable if the output impedance of amplifier 246 is not significantly higher than the load impedance 250 the amplifier 246 is powered off.

When powered on, the amplifier 246 is configured to have an input impedance approximately equal to the source impedance 214. When powered off the amplifier 246 has an input impedance much higher than the source impedance 214.

Low noise amplifier 230 includes amplifier 236 coupled to input node 202 and shunt resistor 234, which is shunt to ground 224 via switch 232 when a second logical signal SEL2 is asserted. In this configuration, amplifier 236 has a lower gain, but a wider adjustable gain range than amplifier 246. Amplifier 236 also has a NF that is higher than amplifier 246.

The input impedance of amplifier 236 is made very high so that the input impedance of amplifier 230 is approximately the value of resistor 234 when switch 232 is closed (i.e. when the second logical signal SEL2 is asserted). In such an embodiment, the input impedance of the amplifier 230 is much higher than impedance 214 when the second logical signal SEL2 is not asserted. In an embodiment, the second logical signal SEL2 is a logical inversion of the first logical signal. In such embodiment, the value of resistor 234 is chosen to be substantially equal to impedance 214. Amplifier 236 receives power from voltage source VDD2 by powering off amplifier 236. An optional switch 239 can be used to provide a power savings by powering off amplifier 246 when amplifier 246 is powered on. In such an arrangement, amplifier 236 receives power only when switch 239 is closed.

In an embodiment, node 224 is ground. In various embodiments, the potential at node 224 is other than ground. Throughout this disclosure, a ground symbol denotes a circuit node with a fixed DC (direct-current) potential. In case there are two or more ground symbols, their respective DC potentials may be different.

When a second logical signal SEL2 is asserted, switch 232 is closed and resistor 234 is connected to a reference potential node 224. In an embodiment, the state of signal SEL2 is the opposite state of signal SEL1. Thus, when SEL2 is asserted the input signal at node 202 is transmitted to output node 204 through amplifier 236. When SEL2 is de-asserted, switch 232 is open and resistor 234 is placed in a floating state such that the input impedance of amplifier 230 corresponds to just that of the impedance of amplifier 236, which is high(relative to the value of the source impedance 214).

An optional switch 238 configures to receive signal SEL2 can be asserted between amplifier 236 and impedance 250. Switch 238 can be used to further electrical isolation between amplifier 236 and the output impedance 250 when amplifier 236 is powered off.

In view of the above, when logical signal SEL1 is asserted, logical signal SEL2 is de-asserted, and the input impedance of 240 is substantially equal to impedance 214. Since the input impedance of amplifier 230 is much higher than impedance 214 when switch 232 is open, the input impedance of amplifier 220 is therefore approximately equal to impedance 214 and a good input match to the source circuit 210 is achieved. When logical signal SEL1 is de-asserted, logical signal SEL2 is asserted, the input impedance amplifier 240 is much higher than impedance 214, and the input impedance of amplifier 230 is substantially equal to the value of the resistor 234. The input impedance of amplifier 220 is again approximately equal to impedance 214 and good input impedance matching between amplifier 220 and source circuit 210 is achieved. Therefore, the input impedance of amplifier 220 can be matched to source impedance 214, independent of the state of signals SEL1 and SEL2.

In view of the above, amplifier 220 has a NF and gain associated only with either amplifier 236 or amplifier 246. In an embodiment, signals SEL1 and SEL2 are complementary signals. In some embodiments, SEL2 is generated by inverting logical signal SEL1. Therefore, SEL1 alone be used to enable amplifier 240 and amplifier 230.

As described, amplifier 220 can be configured to operate in one of two modes based on the state of signals SEL1 and SEL2. The first mode occurs when SEL1 is asserted and SEL2 is de-asserted. The second mode occurs when SEL1 is de-asserted and SEL2 is asserted. In the first mode, amplifier 240 can be used to provide good input impedance matching to source circuit 210 over a wide range of frequencies since the input impedance of amplifier 230 is very high. In the second mode, because the input impedance amplifier 236 and amplifier 240 are high, resistor 234 can be used to provide good input impedance matching of amplifier 220 to source circuit 210 over a wide frequency range.

It is generally difficult to design an LNA, such as amplifier 240, with a widely adjustable range of gain, while also maintaining a good input impedance match with a source circuit. Consequently, amplifier 240 can be designed to provide a narrow range of adjustable gain. Although amplifier 230 can provide a wide range of adjustable gain, while also maintaining a good input impedance match to a source circuit, the thermal noise introduced by resistor 234 may result in amplifier 230 not having a very low NF. However, a very low NF may not be necessary if the signal at node 202 is sufficiently high and the gain of amplifier 230 does not need to be high. In such instances, the first mode and second modes can be selected according to a gain requirement or a desired range of gain. Since amplifier 240 is not required to provide a widely-adjustable range of gain, it can be used to achieve good input impedance matching and low NF within a limited range of adjustable gain. Since amplifier 230 is not required to have a very low NF, it can be used to provide a widely-adjustable range of gain. The combination of the two modes allows for the use of different amplifier topologies, each optimized to provide a different gain range while not significantly compromising the needed NF of amplifier 220, nor the ability to match the source impedance.

By way of example and not limitation, amplifier 220 can be configured to provide an adjustable gain ranging from about −20 dB to about 17 dB. Here, the first mode can be configured to provide an adjustable gain ranging from about 7 dB to about 17 dB and the second mode ranging from about −20 dB to 7 dB. The NF of amplifier 220 in the first mode of this example can be made less than 3 dB and greater than 3 dB in the second mode. In each mode, the input impedance of the amplifier can be readily matched to a source circuit.

Figure 3:
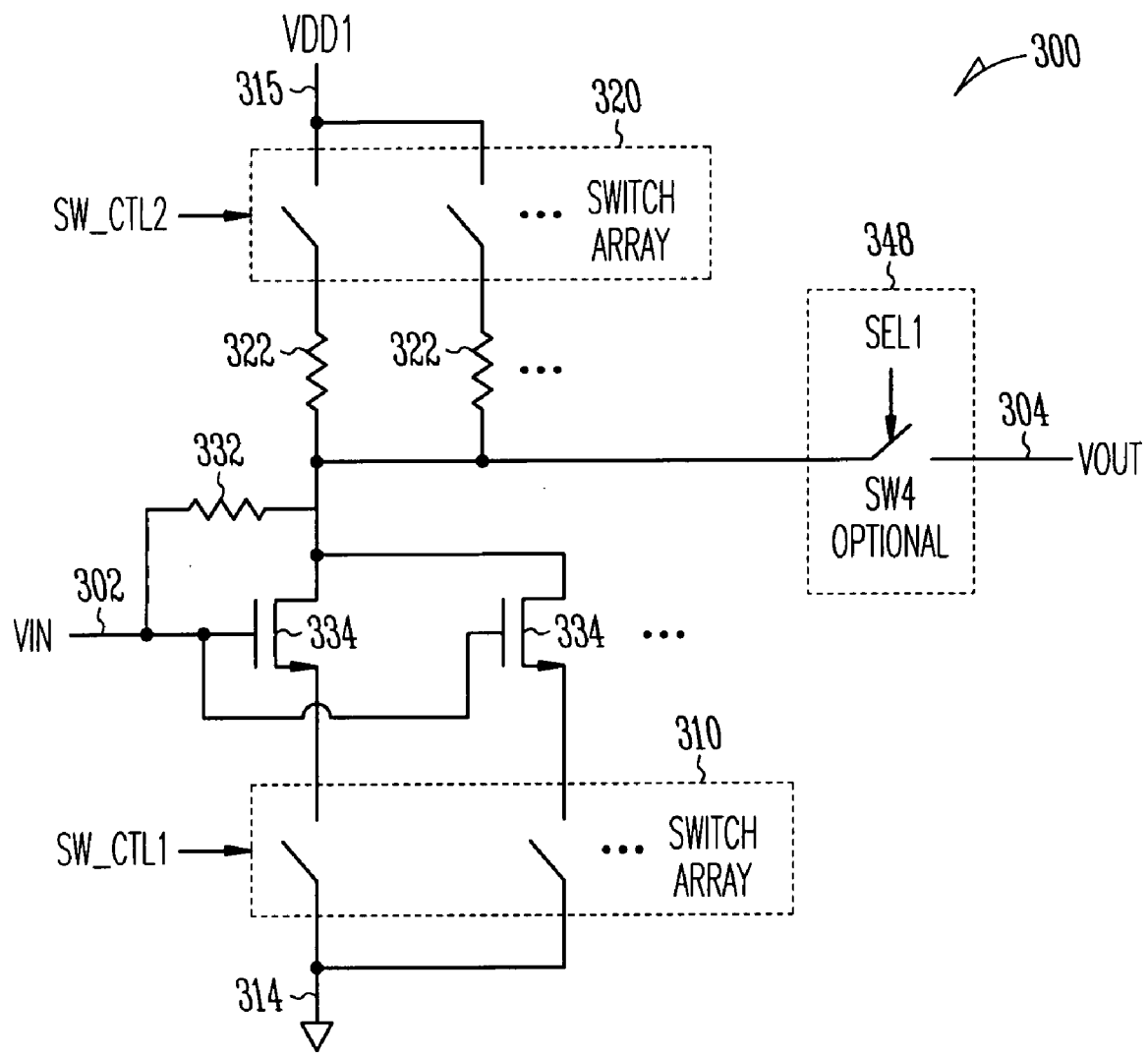
FIG. 3 illustrates an amplifier circuit according to various embodiments of the invention.

FIG. 3 illustrates an amplifier circuit according to various embodiments of the invention. Here, amplifier circuit 300 is example of a sub-circuit forming sub-circuit 240. Circuit 300 is configured as a shunt-series amplifier incorporating a plurality of NMOS transistors 334 arranged in a common-source amplifier topology. Switch array 310 is coupled between the source terminals of transistors 334 and reference node 314. Reference node 314 can be set to a potential based on transistor types, e.g., NMOS or PMOS, an available supply voltage, or a required voltage differential between reference node 314 and input node 302. Therefore, node 314 can be at ground potential or a potential greater than or less than zero. A feedback resistor 332 is connected to input node 302 between the gate transistors 334 and drain resistors 322. Resistors 322 are coupled to switch array 310 to connect VDD1 to provide power and a bias voltage to transistors 334. In some embodiments, a current source is used to provide circuit power and to bias the transistors 334.

Switch array 310 is configured to receive switch a set of control signals SW_CTL1 and switch array 320 is configured to receive a set of switch control signals SW_CTL2. Signals SW_CTL1 can be asserted to selectively connect one or more of transistors 334 to reference node 314. Resistors 322 along with the trans-conductance of transistors 334 can be chosen to provide a narrow range of adjustable gain and at the same time maintain a good match between the input impedance of circuit 300 and the impedance of the source circuit. Signals SW_CTL2 can be asserted to selectively couple VDD1 to resistors 322 to adjust the gain of circuit 300. The input impedance of circuit 300 is determined by the combination resistance 332, resistors 322, and the trans-conductance of transistors 334. The desired trans-conductance of transistor 334 can be established by properly choosing the gate width and length dimensions of each transistor. Signals SW_CTL2 also place transistors 334 in a powered-off state to provide a power savings. In this case, the first logical signal SEL1 is implicit and is implied by signals SW_CTL2.

An optional switch 348 can be configured to receive signal SEL1. Switch 348 can be used to improve the electrical isolation of circuit 300 when VDD1 is not connected to transistors 334, if the output impedance of circuit 300 is not significantly higher than the load impedance.

As described above, the gate dimensions transistors 334 and values for resistors 322, in combination with signals SW_CTL1 and SW_CTL2 can be chosen to provide good input matching between a source circuit and circuit 300, a low NF, and a narrow range of adjustable gain.

Figure 4:
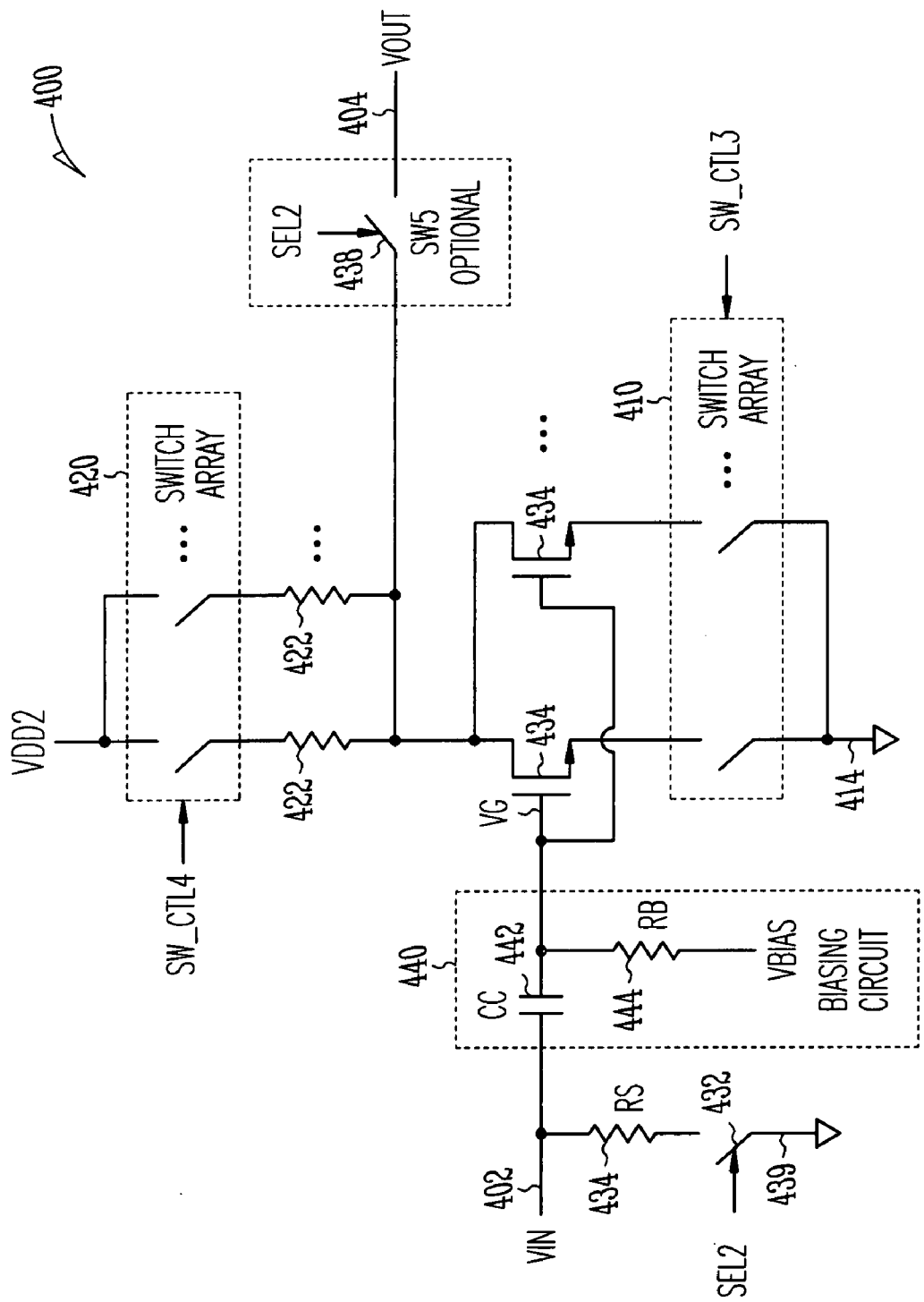
FIG. 4 illustrates an amplifier circuit according to various embodiments of the invention.

FIG. 4 illustrates an amplifier circuit according to various embodiments of the invention. Here, amplifier circuit 400 is example of a sub-circuit forming sub-circuit 230. Circuit 400 includes a plurality of NMOS transistors 434 arranged in a common-source amplifier topology.

A bias circuit 440 is connected to the gates of transistors 434. Bias circuit 440 includes a capacitor 442 and a high impedance bias resistor 444 coupled to a biasing voltage, VBIAS. In general, VBIAS depends on transistor type (e.g., PMOS, NMOS). Input node 402 is further selectively coupled to a reference node 439 by shunt resistor 434 using switch 432 controlled by signal SEL2. The value of resistor 434 can be selected to match an impedance associated with an input circuit, as described above.

Switch array 420 is configured to receive a set of logical signals SW_CTL4 to couple VDD2 to resistors 422 to provide power to transistors 434. The values of resistors 422 can be chosen to provide a wide range of adjustable gain. A current source can be substituted for VDD2 to provide power and to bias transistors 434. Signals SW_CTL4 can also place transistors 434 in a powered-off state to provide a power savings.

Transistors 434 are connected to switch array 410 to selectively couple the transistors to reference node 414 according to a set of logical signals SW_CTL3. The potential of reference node 414 need not be limited to ground, but can be a potential based on a transistor type, e.g., NMOS or PMOS, an available supply voltage, or a required voltage differential.

An optional switch 438 is configured to receive signal SEL2 to increase the electrical isolation of circuit 400 when VDD2 is not connected to transistors 434, if the output impedance of circuit 400 is not significantly higher than the load impedance (not shown). In an alternative embodiment not shown in the figure, the bias circuit 442 is removed and the circuit node 402 is directly connected to the gates of transistors 434, and the ground node 439 is replaced by the biasing voltage VBIAS.

As described above, circuit 400 enables good impedance matching to a source circuit. The gate dimensions of transistors 434 and the values of resistors 422, in combination with signals SW_CTL1 and signals SW_CTL2 can be chosen to provide wide-range of adjustable gain and a NF that is sufficiently low for receiver applications.

The design of circuits 300 and 400 is flexible. The amplifier topologies are not limited to the shunt-series amplifier and the common-source amplifier illustrated in FIGS. 3 and 4. For example, a common-gate amplifier topology can be substituted for shunt-series and common-source topologies. A two-stage amplifier topology or a cascode amplifier topology can also be used. Moreover, fully differential or pseudo-differential circuit topologies can be used in place of the single-ended design shown in FIGS. 3 and 4. At the discretion of circuit designers, a transistor can be biased in various topologies without departing from the scope of the present invention. A switch can be implemented by using a NMOS transistor, a PMOS transistor, or a combination of both. The implementation of a switch is well known to those of ordinary skills in the art and thus not described here. At the discretion of circuit designers, a transistor under a proper biasing condition can be used to implement a "resistor." At the discretion of circuit designers, a PMOS transistor can be used in lieu of a NMOS transistor for implementing an amplifier. At the discretion of circuit designers, an AC (alternative current) coupling capacitor can be inserted to provide isolation of DC voltages between any two sub-circuits, as long as capacitance value of the capacitor is sufficiently high and the DC voltages for both sub-circuits are well defined. In the embodiment 200 of FIG. 2, for instance, an AC coupling capacitor (not shown in the figure) can be inserted between amplifier 220 and the load impedance 250, or between source circuit 210 and amplifier 220.

Figure 5:
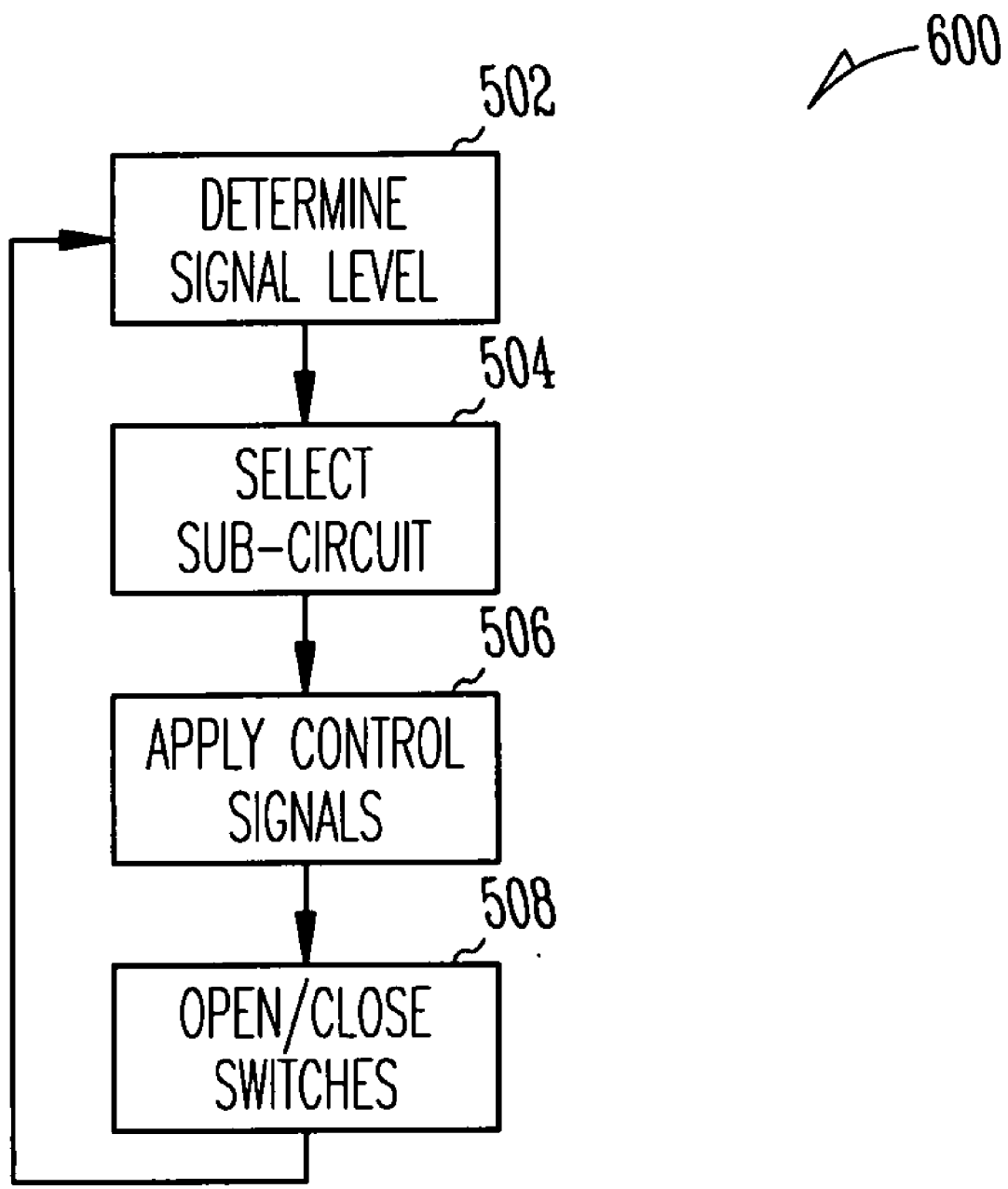
FIG. 5 illustrates a method according to various embodiments of the invention.

FIG. 5 illustrates a method according to various embodiments of the invention. The method 500 begins at block 502 where a signal strength is determined.

At block 504, one of a first sub-circuit or a second sub-circuit is selected based on the signal strength, a frequency range, a desired signal gain, a NF, or an input impedance requirement. In some embodiments, selecting one of a first sub-circuit or a second sub-circuit includes selecting an amplifier to isolate from and output node.

At block 506, one or more control signals are transmitted to the first and the second sub-circuits to open and close one or more switches to power at least one amplifier and to de-power at least one different amplifier. The control signals can also be used to turn off switches to isolate an amplifier in a de-powered state. In some embodiments, control signals are used to selectively couple resistors to transistors to match an impedance of a source circuit. In some embodiments, control signals are used to a select a resistance to adjust input impedance. The control signals transmitted to the first and second sub-circuits are logical signals. In some embodiments, the logical signals received by the first and second sub-circuits are complementary signals. In some embodiments, the control signals are transmitted as sets of control signals.

At block 508, the specified switches in each of the first sub-circuit and the second sub-circuit are either opened or closed according to the signals asserted. If at least one of the switches associated with the first sub-circuit is closed so that the first sub-circuit receives power, then at least one of the switches in the second sub-circuit is open. Consequently, the amplifier portion of the first sub-circuit receives power while a resistor used for coupling the input node of the second sub-circuit to a reference node is allowed to float. The amplifier portion of the second sub-circuit may also be deactivated. The amplifier portion of the second sub-circuit can be further isolated from the output node using a switch, such as switch 238 and switch 438. Here, the signal transmitted to the output node has a signal gain, input and output impedance, and a NF associated only with the first sub-circuit.

If at least one of the switches associated with the first sub-circuit is open so that the first sub-circuit receives no power, then at least one of the switches in the second sub-circuit is closed. Consequently, the amplifier portion of the first sub-circuit is deactivated and a resistor in the second sub-circuit is connected between the input node and a reference node to match the impedance of a source circuit. The amplifier portion of the first sub-circuit can be further isolated from the output node using a switch, such as switch 238 and switch 348. Here, the signal transmitted to an output node has a signal gain, input and output impedance, and NF associated only with that of the second sub-circuit.

The above method further allows the input signal to be continuously monitored enabling real time adjustment of signal gain and input impedance to maintain optimum receiver performance.

The above description of a receiver is not exclusive or exhaustive, but is intended to illustrate one possible arrangement of a receiver in a manner so to not obscure the invention.

Accordingly, it will be recognized by one of ordinary skill in the art that further arrangements are possible.

For some applications a receiver must operate over a wide band or range of frequencies ("wide-band"). An amplifier that can operate over a wide-band with a low noise figure can improve the quality of a received signal. This is particularly true for free-space transmission systems because atmospheric weather conditions are dynamic, and because transmission distances for the mobile user can continuously change. It will be appreciated that the above noted problems and applications can be addressed with amplifiers having a low noise figure and improved dynamic response over a wide range of frequencies.

The above Detailed Description is intended to be illustrative, and not restrictive. The various embodiments are not necessarily mutually exclusive, as some embodiments can be combined with one or more other embodiments to form new embodiments. For example, the above-described embodiments (and/or aspects thereof) embodiments may be combined, utilized and derived therefrom, such that structural and logical substitutions and changes may be made without departing from the scope of this disclosure. Such embodiments of the inventive subject matter may be referred to herein, individually and/or collectively, by the term "invention" merely for convenience and without intending to voluntarily limit the scope of this application to any single invention or inventive concept if more than one is in fact disclosed. Many other embodiments will be apparent to those of skill in the art upon reviewing the above description. The scope of the invention should, therefore, be determined with reference to the appended claims, along with the full scope of equivalents to which such claims are entitled.

The methods described herein do not have to be executed in the order described, or in any particular order, unless it is otherwise specified that a particular order is required. Moreover, unless otherwise specified, various activities described with respect to the methods identified herein can be executed in repetitive, simultaneous, serial, or parallel fashion.

The terms "a" or "an" are used, as is common in patent documents, to include one or more than one. The term "or" is used to refer to a nonexclusive or, unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The Abstract of the Disclosure is provided to comply with 37 C.F.R. § 1.72(b), requiring the abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. An amplifier, comprising:
   a first sub-circuit, wherein the first sub-circuit includes a first sub-amplifier configured to receive power when a first logical signal is asserted; and
   a second sub-circuit, the second sub-circuit coupled in parallel with the first sub-circuit, wherein the second sub-circuit includes a second sub-amplifier configured with an input node that is shunted to a reference node via an electrical resistance when a second logical signal is asserted.

2. The amplifier of claim 1, wherein the first sub-amplifier is adapted to couple to an output node when the first logical signal is asserted.

3. The amplifier of claim 1, wherein the second sub-amplifier is configured to receive power when the second logical signal is asserted.

4. The amplifier of claim 3, wherein the second sub-amplifier is adapted to couple to an output node when the second logical signal is asserted.

5. The amplifier of claim 1, wherein the first sub-circuit includes a noise figure that is lower than a noise figure of the second sub-circuit noise figure.

6. The amplifier of claim 1, wherein first sub-circuit is configured so that its input impedance substantially matching a source impedance when the first logical signal is asserted.

7. The amplifier of claim 6, wherein the first sub-circuit includes a resistor and a transistor having at least three terminals, wherein the resistor is connected to a first terminal of the transistor on one side and connected to a second terminal of the transistor on the other side.

8. The amplifier of claim 6, wherein the first sub-circuit includes a resistor and a plurality of transistors, each having at least three terminals, and wherein the resistor is connected to a first terminal of the transistors on one side and connected to a second terminal of the transistors on the other side.

9. The amplifier of claim 1, wherein the first sub-circuit includes a transistor configured in a shunt-series amplifier topology.

10. The amplifier of claim 1, wherein the second sub-circuit includes a transistor configured in a common-source amplifier topology.

11. The amplifier of claim 1, wherein at least one of the first sub-circuit and the second sub-circuit includes two transistors in a cascode amplifier topology.

12. The amplifier of claim 1, wherein first sub-circuit is configured to provide a higher gain than the second sub-circuit.

13. The amplifier of claim 1, wherein at least one of the first sub-circuit and the second sub-circuit is configured in a fully differential circuit topology.

14. The amplifier of claim 1, wherein at least one of the first sub-circuit and the second sub-circuit is configured in a pseudo-differential circuit topology.

15. An amplifier having an input port, an output port, and a resistor, the amplifier comprising:
    a first sub-circuit including a first port coupled to the input port and a second port coupled to the output port, wherein the first sub-circuit includes a first sub-amplifier configured to receive power when a first logical signal is asserted;
    a second sub-circuit including a third port coupled to the input port and a fourth port coupled to the output port; and wherein the input port is configured to be shunted to a reference node by the resistor when a second logical signal is asserted.

16. The amplifier of claim 15, wherein the second sub-circuit includes a second-sub amplifier configured to receive power when the second logical signal is asserted.

17. The amplifier of claim 15, wherein the first sub-circuit includes a set of transistors, each having at least three terminals, a first terminal of said transistors coupled to a first fixed-potential node via a first set of switches controlled by a first set of logical signals, and a second terminal of said transistors coupled to a second fixed-potential node via a second set of switches controlled by a second set of logical signals.

18. The amplifier of claim 17, wherein the first sub-circuit includes an input impedance is approximately equal to a source-impedance when at least one of said transistors is coupled to both the first fixed-potential node and the second fixed-potential node.

19. The amplifier of claim 15, wherein the second sub-circuit includes a set of transistors, each having at least three terminals, a first terminal of said transistors coupled to a first fixed-potential node via a first set of switches controlled by a first set of logical signals, and a second terminal of said transistors coupled to a second fixed-potential node via a second set of switches controlled by a second set of logical signals.

20. The amplifier of claim 19, wherein the second sub-circuit includes an input impedance that is substantially higher than a source impedance, independent of the states of the first set of logical signals and the second set of logical signals.

21. The amplifier of claim 15, wherein the first sub-circuit is configured to be decoupled from the output node when the first logical signal is de-asserted.

22. The amplifier of claim 15, wherein the second sub-circuit is configured to be decoupled from the output node when the second logical signals is de-asserted.

23. The amplifier of claim 15, wherein first sub-circuit includes a transistor arrangement configured in a shunt-series amplifier topology.

24. The amplifier of claim 15, wherein second sub-circuit includes a transistor arrangement configured in a common-source amplifier topology.

25. The amplifier of claim 15, wherein second sub-circuit is configured to provide a lower gain over a wider adjustable range of gain than the first sub-circuit.

26. The amplifier of claim 15, wherein at least a portion of a transistor arrangement associated with at least one of the first sub-circuit and the second sub-circuit include a cascode amplifier topology.

27. The amplifier of claim 15, wherein at least a portion of a transistor arrangement associated with at least one of the first sub-circuit and the second sub-circuit include a common-gate amplifier topology.

28. The amplifier of claim 15, wherein at least a portion of a transistor arrangement associated with at least one of the first sub-circuit and the second sub-circuit include a plurality of transistors in a differential pair configuration.

29. A method comprising:
determining a signal strength;
coupling an input signal to an output node using a first amplifier by activating the first amplifier using a first logic signal if the signal strength is below a threshold value; and
coupling the input signal to the output node using a second amplifier by deactivating the first amplifier and shunting an input node of the second amplifier to a reference node with a resistor using a second logic signal if the signal strength is equal to or higher than the threshold value.

30. The method of claim 29, wherein activating the first amplifier includes deactivating the second amplifier.

31. The method of claim 29, wherein using the first and second logical signals include using first and second logical signals that are complementary signals.

32. The method of claim 29, wherein coupling the input signal to the output node using the first amplifier includes making the input impedance of the first amplifier substantially matches a source impedance.

33. The method of claim 29, wherein coupling the input signal to the output node using the second amplifier includes making the input impedance of the second amplifier substantially matches a source impedance.

34. The method of claim 29, wherein the noise figure of the first amplifier upon activation is lower than the noise figure of the second amplifier.

35. The method of claim 29, wherein the first amplifier has a first adjustable gain controlled by a first set of logical signals.

36. The method of claim 35, wherein the second amplifier has a second adjustable gain controlled by a second set of logical signals.

37. The method of claim 31, wherein the first adjustable gain has a first range, the second adjustable gain has a second range, and the second range is wider than the first range.

* * * * *

UNITED STATES PATENT AND TRADEMARK OFFICE
CERTIFICATE OF CORRECTION

PATENT NO. : 7,639,075 B2  Page 1 of 1
APPLICATION NO. : 11/831724
DATED : December 29, 2009
INVENTOR(S) : Chia-Liang Lin It is certified that error appears in the above-identified patent and that said Letters Patent is hereby corrected as shown below:

On the Title page, in field (73), in "Assignee", in column 1, line 1, delete "Corporation" and insert -- Corporation, --, therefor.

In column 11, line 5, in Claim 16, delete "second-sub amplifier" and insert -- second sub-amplifier --, therefor.

Signed and Sealed this

Twenty-third Day of March, 2010

David J. Kappos
*Director of the United States Patent and Trademark Office*